United States Patent
Baek et al.

(10) Patent No.: US 9,320,142 B2
(45) Date of Patent: Apr. 19, 2016

(54) ELECTRODE STRUCTURE

(71) Applicant: SAMSUNG ELECTRO-MECHANICS CO., LTD., Suwon (KR)

(72) Inventors: Seung Min Baek, Busan (KR); Yoon Su Kim, Suwon (KR); Jin Hyuck Yang, Yongin (KR); Chang Bae Lee, Yongin (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 14/598,595

(22) Filed: Jan. 16, 2015

(65) Prior Publication Data
US 2015/0334832 A1     Nov. 19, 2015

(30) Foreign Application Priority Data
May 13, 2014  (KR) .................. 10-2014-0057291

(51) Int. Cl.
  H05K 1/11     (2006.01)
  H05K 3/40     (2006.01)
  H05K 3/18     (2006.01)

(52) U.S. Cl.
  CPC ............. *H05K 1/111* (2013.01); *H05K 3/188* (2013.01); *H05K 3/4007* (2013.01); *H05K 2201/09381* (2013.01); *H05K 2203/0723* (2013.01); *Y10T 428/12396* (2015.01)

(58) Field of Classification Search
None
See application file for complete search history.

(56) References Cited

U.S. PATENT DOCUMENTS

| | | | | |
|---|---|---|---|---|
| 6,277,263 | B1* | 8/2001 | Chen | C23C 28/322 205/170 |
| 6,399,479 | B1* | 6/2002 | Chen | H01L 21/76862 257/E21.585 |
| 6,660,153 | B2* | 12/2003 | Merricks | C25D 3/38 205/115 |
| 6,727,592 | B1* | 4/2004 | Woo | H01L 21/76843 257/761 |
| 6,995,088 | B2* | 2/2006 | Aggarwal | H01L 21/2885 257/E21.175 |
| 2002/0150795 | A1* | 10/2002 | Kodama | G11B 5/656 428/831 |
| 2007/0052104 | A1* | 3/2007 | Yang | H01L 21/76855 257/762 |
| 2007/0066081 | A1* | 3/2007 | Cheng | C23C 18/1653 438/758 |
| 2009/0029108 | A1* | 1/2009 | Barth | H01L 21/76843 428/156 |
| 2009/0212426 | A1* | 8/2009 | Ishizeki | H01L 21/76816 257/737 |
| 2011/0214285 | A1* | 9/2011 | Chrysler | H01L 23/373 29/830 |
| 2015/0001684 | A1* | 1/2015 | Stout | H01L 21/76837 257/620 |

FOREIGN PATENT DOCUMENTS

KR    10-2009-0087149    8/2009

* cited by examiner

*Primary Examiner* — Scott B Geyer
(74) *Attorney, Agent, or Firm* — NSIP Law

(57) ABSTRACT

The present invention relates to an electrode structure which includes: a base substrate; a seed layer provided on one or both surfaces of the base substrate; an electroplating layer provided on the seed layer; and barriers discontinuously provided between the seed layer and the electroplating layer.

6 Claims, 4 Drawing Sheets

ELECTRODE STRUCTURE

CROSS-REFERENCE TO RELATED APPLICATIONS

This application claims the foreign priority benefit under 35 U.S.C. Section 119 of Korean Patent Application No. 10-2014-0057291, filed May 13, 2014, the entire disclosure of which is hereby incorporated by reference in its entirety into this application.

BACKGROUND

1. Field of the Invention

The present invention relates to an electrode structure, and more particularly, to an electrode structure of circuit wiring implemented on a printed circuit board etc.

2. Description of the Related Art

A printed circuit board (PCB) is manufactured by arranging and fixing electronic devices such as semiconductor chips on one or both surfaces of boards made of various synthetic resins, such as phenolic resin insulation plates and epoxy resin insulation plates and implementing circuit wiring for mutual electrical connection between the electronic devices. In recent times, there is an increasing demand for the densification of circuit wiring with the miniaturization of electronic products.

And, in order to meet this demand, as a method of forming circuit wiring, a modified semi-additive process (MSAP) or semi-additive process (SAP) method is widely used.

Looking into a process of forming circuit wiring by an SAP method with reference to the related art document (Korean Patent Publication No. 10-2009-0087149), first, after a seed layer is formed on an insulating layer, a photoresist layer made of a photosensitive material for photolithography, such as a dry film, is coated on the seed layer.

Next, a pattern corresponding to circuit wiring is patterned by performing a developing process after selectively exposing the photoresist layer.

Next, an electroplating process is performed to fill a metal material in the space between the patterns, and the photoresist layer is removed. Finally, circuit wiring of a desired pattern is completed by removing the portion of the seed layer, which is exposed to the outside, through an etching process.

However, in order to obtain a residue-free surface in the etching process, the seed layer is over-etched than the thickness of the seed layer. In this process, undercut that a portion of the bottom of the pattern of the circuit wiring may occur or the width of the pattern of the circuit wiring may be lost.

Therefore, in order to implement a fine circuit, it is preferable that the smaller the thickness of the seed layer is, but since the seed layer is etched by the sulfuric acid ($H_2SO_4$) component in the plating solution used in the electroplating process, when the thickness of the seed layer is too small, the electroplating process is not smoothly performed, resulting in the short-circuit between the circuit wiring or the deterioration of signal transmission characteristics of the circuit wiring.

For this reason, a seed layer having at least a predetermined thickness is needed. After all, this acts as an obstacle to the implementation of a fine circuit.

SUMMARY

The present invention has been invented in order to overcome the above-described problems and it is, therefore, an object of the present invention to provide an electrode structure that can smoothly perform an electroplating process while having a thin seed layer.

In accordance with one aspect of the present invention to achieve the object, there is provided an electrode structure including: a base substrate; a seed layer provided on one or both surfaces of the base substrate; an electroplating layer provided on the seed layer; and barriers discontinuously provided between the seed layer and the electroplating layer.

Further, the barriers may be distributed in an island shape.

Further, the barriers may have a higher etch resistance to a plating solution than the seed layer.

Further, the seed layer may be made of Cu or Cu alloys, and the barriers may be made of Ti, Cr, Ta, or alloys thereof.

Further, a bonding layer may be provided between the base substrate and the seed layer.

Further, the bonding layer may be made of the same metal material as the barriers.

Further, in accordance with another aspect of the present invention to achieve the object, there is provided a method for manufacturing an electrode structure, which includes the steps of: forming a seed layer on one or both surfaces of a base substrate; forming barriers on the seed layer; forming an electroplating layer between resist patterns by performing electroplating after forming the resist patterns on one surface of the seed layer having the barriers thereon; and removing the seed layer exposed to the outside after stripping the resist patterns.

Further, in the step of forming the barriers, the barriers may be formed in an island shape.

Further, the step of forming the barriers may be performed by a sputtering method.

Further, the method for manufacturing an electrode structure may further include the step of forming a bonding layer on the base substrate before forming the seed layer.

Further, the bonding layer may be removed together in the step of removing the seed layer exposed to the outside after stripping the resist patterns.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
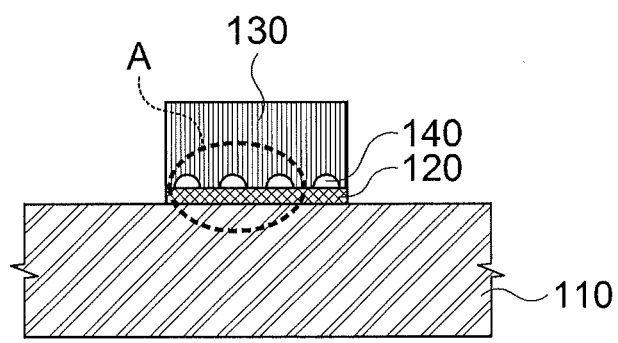
FIG. 1 is a cross-sectional view of an electrode structure in accordance with the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Meanwhile, terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Additionally, elements in the drawing figures are not necessarily drawn to scale. For example, the dimensions of some of the elements in the figures may be exaggerated relative to other elements to help improve understanding of embodiments of the present invention. Meanwhile, the same reference numerals in different figures denote the same elements. For simplicity and clarity of illustration, the drawing figures illustrate the general manner of construction, and descriptions and details of well-known features and techniques may be omitted to avoid unnecessarily obscuring the discussion of the described embodiments of the invention.

Hereinafter, configuration and operational effects of the present invention will be described in detail with reference to the accompanying drawings.

Figure 2:
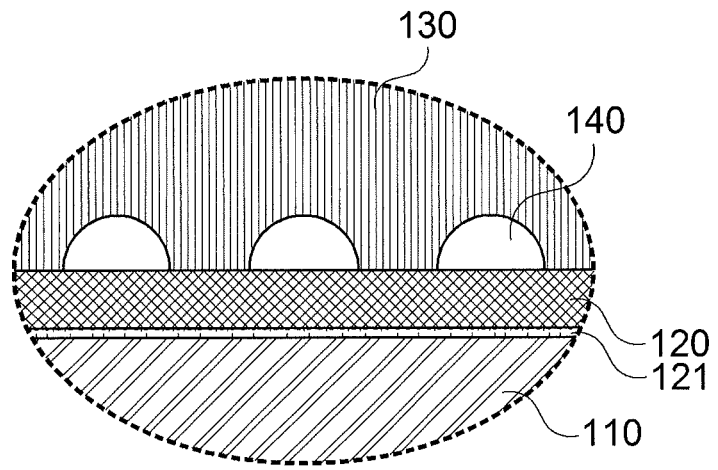
FIG. 2 is an enlarged view of a portion A of FIG. 1.

FIG. 1 is a cross-sectional view of an electrode structure in accordance with the present invention, and FIG. 2 is an enlarged view of a portion A of FIG. 1.

Referring to FIGS. 1 and 2, the electrode structure 100 of the present invention may include a base substrate 110, a seed layer 120 provided on the seed layer 110, an electroplating layer 130 provided on the seed layer 110, and barriers 140 provided between the seed layer 120 and the electroplating layer 130.

In addition, the electrode structure 100 of the present invention may further include a bonding layer 121 provided between the base substrate 110 and the seed layer 120 to improve the adhesion with the base substrate 110.

A constituent material of the bonding layer 121 may be Ti, Cr, Ta, or alloys thereof, and a manufacturing method of the bonding layer 121 may be a sputtering method. When the bonding layer 121 is manufactured by a sputtering method, the above metal or alloy is adhered to a surface of the base substrate 110 to increase the adhesion with the base substrate 110.

The base substrate 110, which supports the electrode structure of the present invention, may be made of a material basically having insulating properties and excellent in heat resistance, moisture resistance, and etch resistance to prevent modification or deformation due to high temperatures, high pressure, and other chemicals.

For example, an optimal polymeric material forming the base material 110 may be one selected from epoxy resins, phenolic resins, urethane resins, silicone resins, and polyimide resins or a prepreg obtained by impregnating reinforcing materials such as glass fibers and inorganic fillers with these polymer resins.

In addition, the base substrate 110 may be a glass substrate or an organic substrate according to the purpose of products or a flexible film substrate for reel-to-reel type continuous manufacture. At this time, preferably, a substrate having an insulating layer formed on a surface thereof is used to secure insulation properties.

The electroplating layer 130 is a metal which forms circuit wiring implemented on a substrate. Although the drawing shows a single-sided substrate in which the electroplating layer 130 is formed only on one surface of the base substrate 110 to clearly explain only the features of the present invention, the electrode structure 100 of the present invention may be applied to various types of substrates such as double-sided substrates and multilayer substrates.

The seed layer 120, which is a metal used as a lead wire to form the electroplating layer 130, may be made of Cu or Cu alloys.

That is, the electroplating layer 130 may be formed by an electroplating process which uses the seed layer 120 as one electrode and an electrode prepared in a plating bath as the other electrode. Accordingly, the seed layer 120 is needed to have a thickness suitable for the electroplating process.

A plating solution used in the electroplating process contains a sulfuric acid ($H_2SO_4$) which reacts with copper (Cu) forming the seed layer. As a result, the seed layer is etched in a predetermined amount during the electroplating process. Therefore, in the prior art, since the seed layer having at least a predetermined thickness is required considering the amount of etching by the plating solution and consequently leads to an increase in loss of patterns when forming the circuit wiring, there is a difficulty in implementing a fine circuit.

However, the electrode structure 100 of the present invention can form the seed layer 120 with a smaller thickness than that required in the prior art by including the barriers 140.

The barriers 140 may be discontinuously formed on one surface of the seed layer 120 bonded to the electroplating layer 130, thus partially blocking the contact between the plating solution and the seed layer 120.

Figure 3:
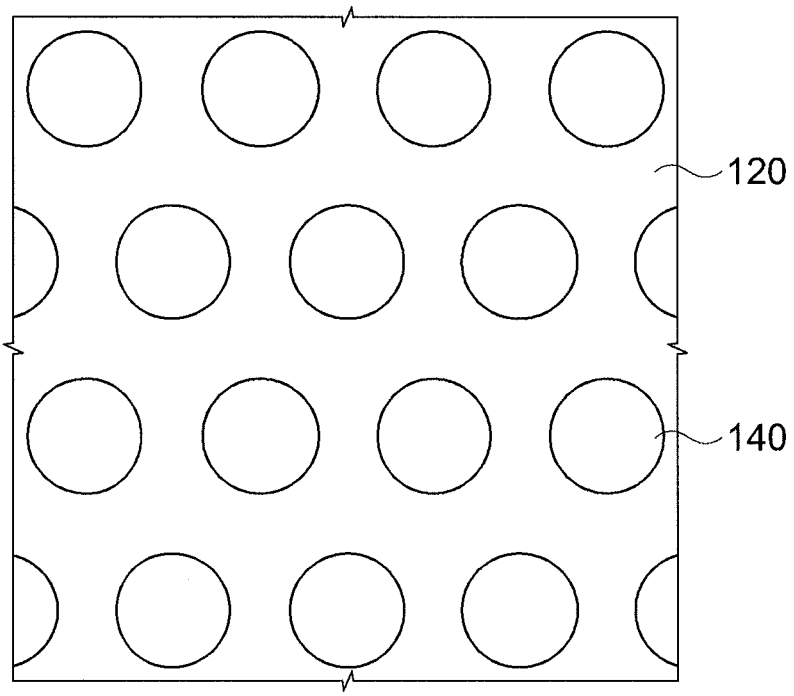
FIG. 3 is a plan view of a seed layer having barriers thereon.

FIG. 3 is a plan view of the seed layer 120 having the barriers 140 thereon. More specifically, the barriers 140 may be dotted on one surface of the seed layer 120 in an island shape. According to the structure as above, the electroplating layer 130 may be formed by depositing metal between the barriers 140 during the electroplating process, and the portion of the seed layer 130, in which the barriers 140 are formed, may not be in contact with the plating solution.

As a result, the present invention can significantly reduce the etch rate of the seed layer than the conventional structure in which the entire surface of the seed layer is in contact with the plating solution, thus forming the seed layer 120 with a smaller thickness than that of the conventional seed layer.

Preferably, a constituent material of the barrier 140 is a metal material having a higher corrosion resistance to sulfuric acid ($H_2SO_4$) than the seed layer 120 in order for the barrier 140 not to be easily etched by the plating solution during the electroplating process.

Although described later, the barrier 140 may be formed using a sputtering method, like the bonding layer 121. Therefore, for the convenience of manufacture, the barrier 140 is preferred to be formed using the same metal as the bonding layer 121, that is, Ti, Cr, Ta or alloys thereof.

Now, a manufacturing method of the present invention will be described.

Figure 4:
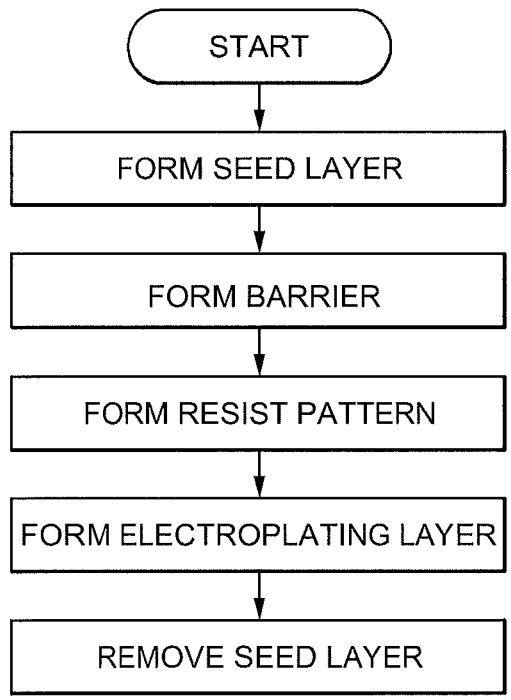
FIG. 4 is a process flowchart of a method for manufacturing an electrode structure in accordance with the present invention.

FIG. 4 is a process flowchart of a method for manufacturing an electrode structure 100 according to the present invention, and FIGS. 5 to 9 are cross-sectional views of the present invention showing each step of FIG. 4.

Figure 5:
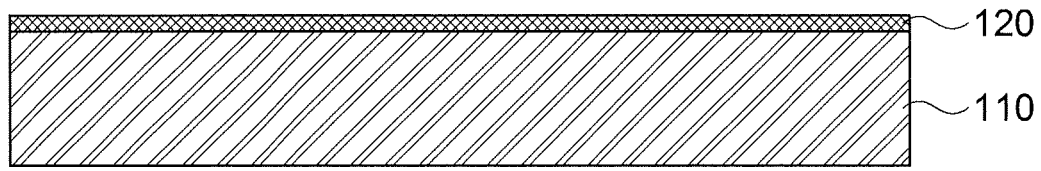
FIGS. 5 to 9 are cross-sectional views of the present invention showing each process of FIG. 4.

In order to manufacture the electrode structure 100 of the present invention, first, as in FIG. 5, a seed layer 120 may be formed on one or both surfaces of a base substrate 110.

As a method for forming the seed layer 120, any method, such as vacuum deposition, electroless plating, or sputtering, can be used if it can deposit metal on a surface of the base substrate 110. Among them, particularly, it is preferred to improve the adhesion with the base substrate 110 using sputtering. Otherwise, before forming the seed layer 120, a bonding layer 121 may be formed on the surface of the base substrate 110, on which the seed layer 120 is to be formed, to improve the adhesion.

Figure 6:
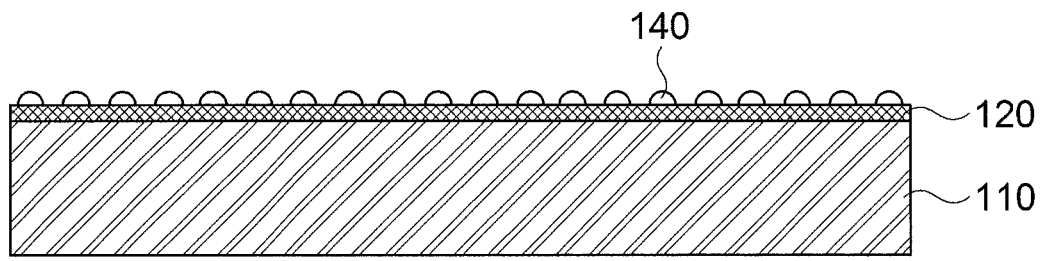

When the seed layer 120 is formed like this, barriers 140 may be formed on the seed layer 120 as in FIG. 6.

The barriers 140 may be formed by a sputtering method. The sputtering method is to deposit a source material on a substrate by generating plasma after injecting a reactive gas (for example, Ar) into a chamber in a vacuum atmosphere. In the initial step of the sputtering, the source materials are distributed and grown in an island shape and clumped together later to form a thin film. The present invention can form the barriers 140 to be dotted in an island shape using the initial step of the sputtering.

Figure 7:
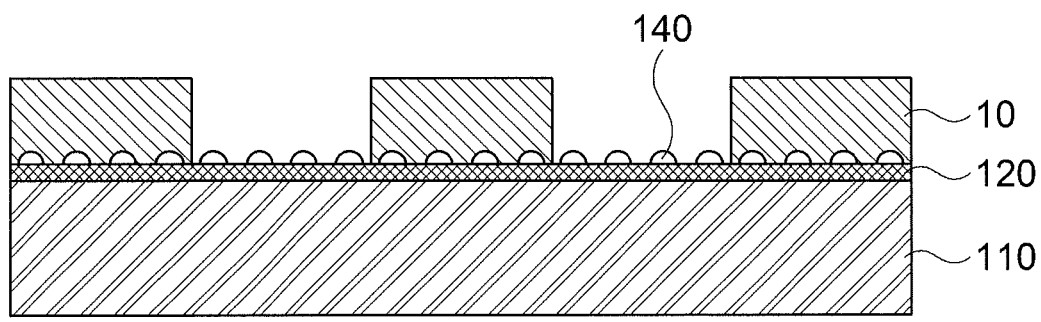

Next, as in FIG. 7, resist patterns 10 may be formed on a surface of the seed layer 120 having the barriers 140 thereon.

The resist patterns 10 may be formed by irradiating light in a state in which a photomask having a desired pattern is arranged on a photoresist (hereinafter, PR) made of a photosensitive resin and continuously performing a developing process to remove the photosensitive resin from the portion in which circuit wiring is to be formed.

Here, the resin forming the PR may be either a negative type of which the portion irradiated with light is cured and not dissolved by a developing solution or a positive type of which the portion irradiated with light is dissolved by a developing solution and a dry film type as well as a liquid type.

Figure 8:
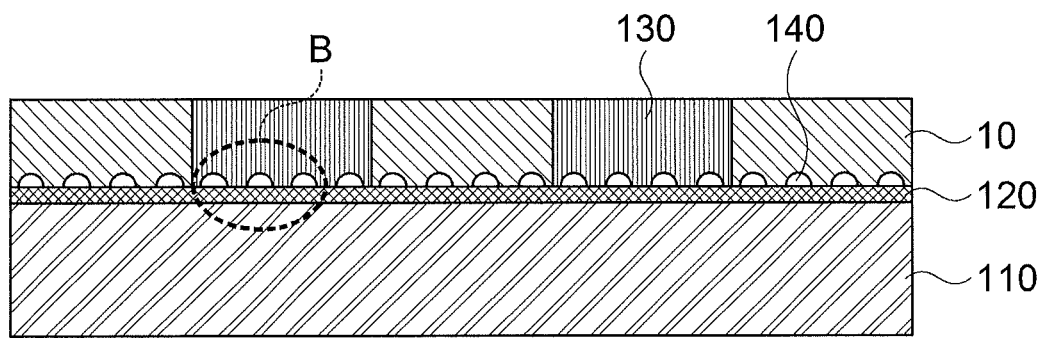

After moving the base substrate 110 having the resist pattern 10 thereon to a plating bath like this, when a voltage is applied using the seed layer 120 as a positive (+) electrode (or negative (−) electrode) and an electrode prepared in the plating bath as a negative (−) electrode (or positive (+) electrode) (electroplating process), an electroplating layer 130 may be formed by depositing metal between the resist patterns 10 (FIG. 8).

More specifically, since the barriers 140 are formed on the surface of the seed layer 120 to be distributed in an island shape, the electroplating layer 130 may be formed by growing the metal deposited between the barriers 140.

Figure 10:
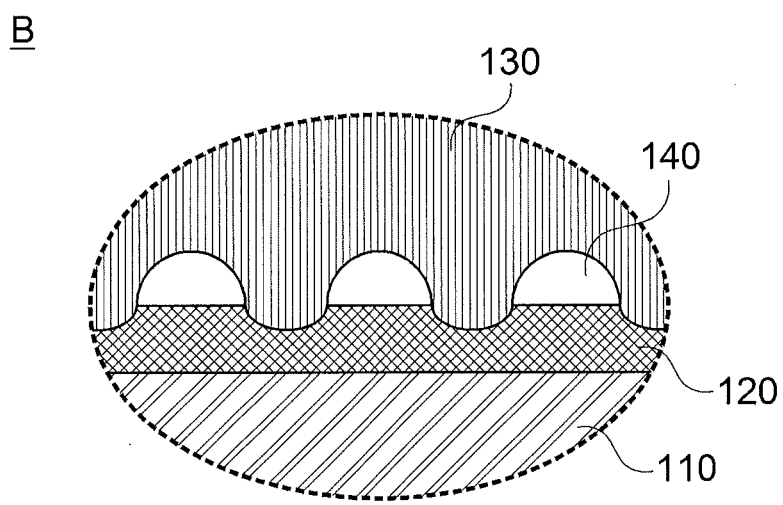
FIG. 10 is an enlarged view of a portion B of FIG. 8.

FIG. 10 is an enlarged view of a portion B of FIG. 8 to explain the etching state of the seed layer 120 shown in the electroplating process of the present invention. Referring to this, since the portion of the seed layer 120, in which the barriers 140 are formed during the electroplating process, is not in contact with a plating solution, only the portion of the seed layer 120 between the barriers 140 is etched in a concave shape. Accordingly, the amount of etching of the seed layer 120 can be significantly reduced than the conventional seed layer structure of which the entire surface is in contact with the plating solution.

Figure 9:
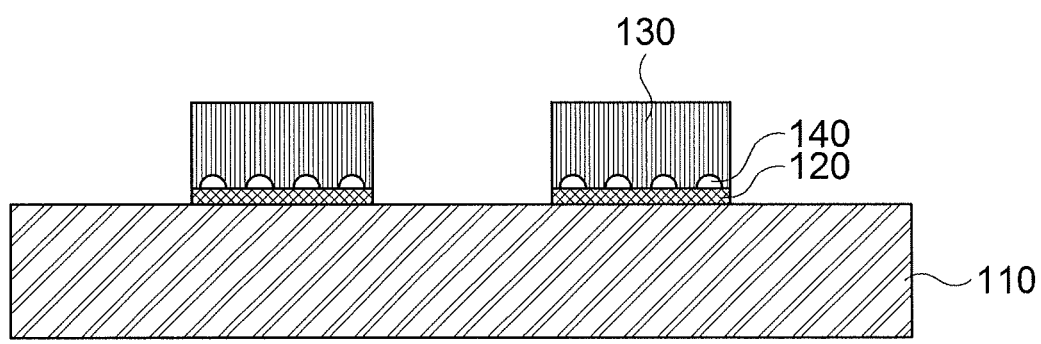

When the electroplating layer 130 is formed like this, the resist patterns 10 may be stripped. Finally, the seed layer 120 exposed to the outside is removed by an etching method such as flash etching or quick etching or removed together with the bonding layer 121 when the bonding layer 121 is formed under the seed layer 120 to insulate the patterns of the circuit wiring (FIG. 9).

As described above, the electrode structure 100 of the present invention can reduce the etch rate of the seed layer 120 by including the barriers 140. Therefore, since the thickness of the seed layer 120 can be reduced than before, it is advantageous to the implementation of a fine circuit without the necessity of performing over-etching in an etching process as before.

According to the electrode structure of the present invention, since the thickness of a seed layer is reduced than before, it is advantageous to the implementation of a fine circuit by reducing the loss of patterns when forming circuit wiring.

Further, it is possible to form circuit wiring without pattern failures by smoothly performing an electroplating process.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An electrode structure comprising:
    a base substrate;
    a seed layer provided on one or both surfaces of the base substrate;
    an electroplating layer provided on the seed layer; and
    barriers discontinuously provided between the seed layer and the electroplating layer.

2. The electrode structure according to claim 1, wherein the barriers are distributed in an island shape.

3. The electrode structure according to claim 1, wherein the barriers have a higher etch resistance to a plating solution than the seed layer.

4. The electrode structure according to claim 1, wherein the seed layer is made of Cu or Cu alloys, and the barriers are made of Ti, Cr, Ta, or alloys thereof.

5. The electrode structure according to claim 1, further comprising:
    a bonding layer provided between the base substrate and the seed layer.

6. The electrode structure according to claim 5, wherein the bonding layer is made of the same metal material as the barriers.

* * * * *